US011699483B2

United States Patent
Kolar et al.

(10) Patent No.: US 11,699,483 B2
(45) Date of Patent: Jul. 11, 2023

(54) MEMORY SYSTEM WITH BURST MODE HAVING LOGIC GATES AS SENSE ELEMENTS

(71) Applicant: Microsoft Technology Licensing, LLC, Redmond, WA (US)

(72) Inventors: Pramod Kolar, Cary, NC (US); Stephen Edward Liles, Apex, NC (US); Gregory Christopher Burda, Raleigh, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 5 days.

(21) Appl. No.: 17/333,691

(22) Filed: May 28, 2021

(65) Prior Publication Data

US 2022/0383945 A1 Dec. 1, 2022

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/418; G11C 11/419
USPC ......................................................... 365/154
See application file for complete search history.

(56) References Cited

U.S. PATENT DOCUMENTS

| | | | | | |
|---|---|---|---|---|---|
| 5,970,003 | A | * | 10/1999 | Miyatake | G11C 29/80 365/225.7 |
| 6,067,257 | A | * | 5/2000 | Kitsukawa | G11C 5/147 365/189.11 |
| 6,333,889 | B1 | * | 12/2001 | Arimoto | G11C 11/4093 365/69 |
| 7,660,167 | B1 | * | 2/2010 | Roge | G11C 11/40615 365/230.06 |
| 2002/0122345 | A1 | * | 9/2002 | Feurle | G11C 8/14 365/230.03 |
| 2009/0161465 | A1 | * | 6/2009 | Lee | G11C 16/10 365/230.02 |
| 2017/0186483 | A1 | | 6/2017 | Singh et al. | |

(Continued)

OTHER PUBLICATIONS

Augustine, et al., "2X-Bandwidth Burst 6T-SRAM for Memory Bandwidth Limited Workloads", In Proceedings of IEEE Symposium on VLSI Circuits, Jun. 16, 2020, 2 Pages.

(Continued)

*Primary Examiner* — Sung Il Cho
(74) *Attorney, Agent, or Firm* — Ranjeev Singh; Singh Law, PLLC (57) ABSTRACT

Memory systems with burst mode having logic gates as sense elements and related methods are provided. A memory system comprises a memory array including a first set of memory cells coupled to a first wordline, a second set of memory cells coupled to a second wordline, and a plurality of sense elements, not including any sense amplifiers. The control unit is configured to generate control signals for: in response to a burst mode read request, simultaneously: (1) asserting a first wordline signal on the first wordline coupled to each of a plurality of first set of bitlines, and (2) asserting a second wordline signal on the second wordline coupled to each of a plurality of second set of bitlines, and as part of a burst, outputting data corresponding to a subset of each of the first set of memory cells and the second set of memory cells.

20 Claims, 8 Drawing Sheets

(56) References Cited

U.S. PATENT DOCUMENTS

2020/0020388 A1* 1/2020 Arsovski ............ G11C 11/4076
2021/0043251 A1 2/2021 Khellah et al.

OTHER PUBLICATIONS

Chang, et al., "A 7nm 256Mb SRAM in High-K Metal-Gate FinFET Technology with Write-Assist Circuitry for Low-VMIN Applications", In Proceedings of International Solid-State Circuits Conference (ISSCC), Feb. 5, 2017, pp. 206-207.

"International Search Report and Written Opinion Issued in PCT Application No. PCT/US22/027544", dated Aug. 8, 2022, 14 Pages.

* cited by examiner

MEMORY SYSTEM WITH BURST MODE HAVING LOGIC GATES AS SENSE ELEMENTS

BACKGROUND

Processors typically include at least one or more processing cores coupled to a random access memory (e.g., a static random access memory (SRAM)) integrated as a single die on an integrated circuit or as multiple die as part of a stack of integrated circuits. Processors for use in machine learning or other artificial intelligence applications require fast access to large chunks of data. As an example, a processor may need access to large amounts of training data and weights that need to be processed to perform machine learning. Other applications of processors may require high bandwidth access to large chunks of data, as well.

To keep up with the demands of processors in applications requiring fast access to large chunks of data while reducing energy usage, there is a continued need for improvements to memory systems.

SUMMARY

In one example, the present disclosure relates to a method for operating a memory system comprising a first memory sub-array and a second memory sub-array, where the first memory sub-array includes a first set of memory cells coupled to a first inner wordline and a second set of memory cells coupled to a first outer wordline, and where the second memory sub-array includes a third set of memory cells coupled to a second inner wordline and a fourth set of memory cells coupled to a second outer wordline. The method may include in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, where each of the second plurality of outer bitlines includes a second portion configured to fly over or fly under a corresponding inner bitline. The method may further include using sense elements, not including any sense amplifiers, sensing bitlines corresponding to a selected set of columns. The method may further include as part of a burst, outputting data from each of the first set of memory cells, the second set of memory cells, the third set of memory cells, and the fourth set of memory cells that are coupled to the selected set of columns.

In another example, the present disclosure relates to a memory system including a memory array including a first set of memory cells coupled to a first wordline and a second set of memory cells coupled to a second wordline. The memory system may further include a plurality of sense elements, not including any sense amplifiers, coupled to a plurality of columns such that each of the plurality of columns has a corresponding sense element. The control unit may be configured to generate control signals for: in response to a burst mode read request, simultaneously: (1) asserting a first wordline signal on the first wordline coupled to each of a plurality of first set of bitlines, and (2) asserting a second wordline signal on the second wordline coupled to each of a plurality of second set of bitlines, and as part of a burst, outputting data corresponding to a subset of each of the first set of memory cells and the second set of memory cells sensed by a selected set of the plurality of sense elements corresponding to a selected set of the plurality of columns.

In yet another example, the present disclosure relates to a memory system including a first memory sub-array and a second memory sub-array, where the first memory sub-array includes a first set of memory cells coupled to a first inner wordline and a second set of memory cells coupled to a first outer wordline, where the second memory sub-array includes a third set of memory cells coupled to a second inner wordline and a fourth set of memory cells coupled to a second outer wordline, where each of the first set of memory cells and the second set of memory cells is organized in a first plurality of columns, and where each of the third set of memory cells and the fourth set of memory cells is organized in a second plurality of columns. The memory system may further include a plurality of sense elements, not including any sense amplifiers, coupled to a plurality of columns such that each of the plurality of columns has a corresponding sense element. The control unit may be configured to generate control signals for: in a first burst mode, in response to a first burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, (4) asserting a fourth wordline signal on the second outer wordline coupled to each of a second plurality of outer bitlines, where each of the second plurality of outer bitlines includes a second portion configured to fly over or fly under a corresponding inner bitline, and using the shared column circuitry, and outputting data from each of the first set of memory cells, the second set of memory cells, the third set of memory cells, and the fourth set of memory cells as part of a burst, or in a second burst mode, in response to a second burst mode read request, simultaneously: (1) asserting a first wordline signal on the first inner wordline coupled to each of a first plurality of inner bitlines, and (2) asserting a second wordline signal on the first outer wordline coupled to each of a first plurality of outer bitlines, where each of the first plurality of outer bitlines includes a first portion configured to fly over or fly under a corresponding inner bitline, and outputting data from each of the first set of memory cells and the second set of memory cells.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to a memory system with burst mode having logic gates as sense elements. Certain examples further relate to a memory system having logic dates, including at least one of an inverter, a NOR gate, or a NAND gate, as sense elements and further having flying bitlines for use in memory read operations, and in particular, burst mode read operations. Traditionally, memory systems include sense amplifiers for sensing the state of a memory cell. In many such memory systems, using precharge circuitry, a sense amplifier precharge signal is asserted prior to sensing the state of the memory cell using the sense amplifier. Certain examples in this disclosure remove the sense amplifier and associated precharge circuitry, which advantageously results in simplified column timing, reduced loading, and improved output performance. This is because while the replacement of the sense amplifier with logic gates requires the development of a large signal on the bitlines, after the bitline signal has been developed, the read out is faster. This results in a better performance, particularly, in the burst mode where multiple data words can be output once the bitline signals have been developed.

Moreover, traditionally, reading of data from a memory even as part of a burst operation is not energy efficient and may not have high enough bandwidth to meet the demand for data from faster processing cores. This results in an energy inefficient memory coupled with a processor that has to wait longer to receive data from the memory in response to a read request. Certain examples in this disclosure relate to memory systems that both improve the energy efficiency of the read operations and support a higher bandwidth to satisfy the demand for data from the faster processing cores or other processing logic (e.g., FPGA logic).

Figure 1:
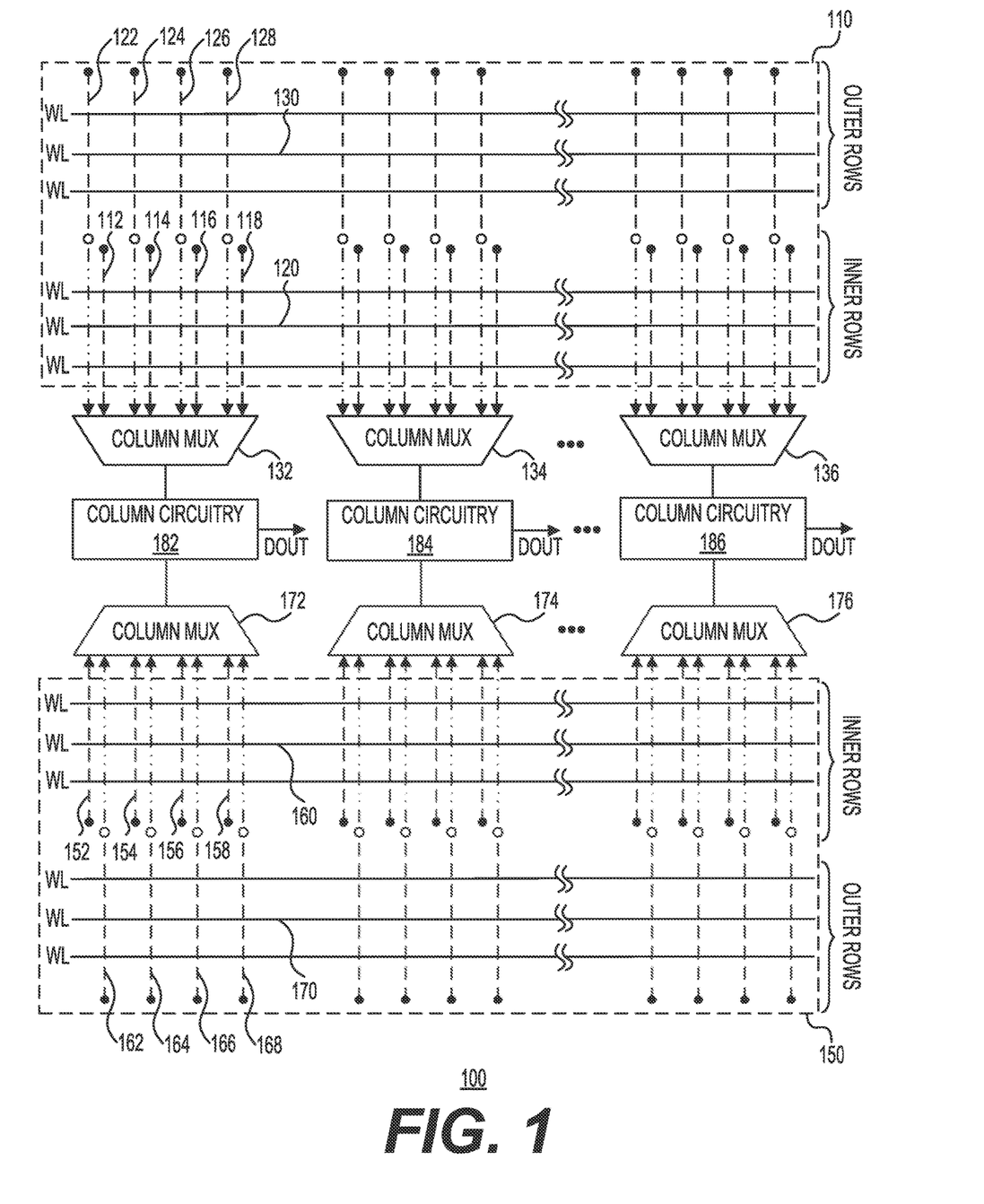
FIG. 1 shows a schematic diagram of a memory having a sense element, not including a sense amplifier, in accordance with one example.

FIG. 1 shows a schematic diagram of a memory 100 having a sense element, not including a sense amplifier, in accordance with one example. Memory 100 may include memory sub-array 110 and memory sub-array 150. Memory sub-array 110 may include a set of wordlines (WLs) corresponding to the inner rows (e.g., wordline 120) and another set of wordlines (WLs) corresponding to the outer rows (e.g., wordline 130). Memory sub-array 110 may further include a set of inner bitlines 112, 114, 116, and 118 and a set of outer bitlines 122, 124, 126, and 128. Similarly, memory sub-array 150 may include a set of inner wordlines (WLs) (e.g., wordline 160) and another set of outer wordlines (WLs) (e.g., wordline 170). Memory sub-array 150 may further include a set of inner bitlines 152, 154, 156, and 158 and a set of outer bitlines 162, 164, 166, and 168. In one example, during a burst read operation each of wordlines 120 and 130 of memory sub-array 110 and each of wordlines 160 and 170 of memory sub-array 150 may be simultaneously asserted to avow for access to memory cells connected to both inner and outer bitlines of each of the memory sub-arrays.

With continued reference to FIG. 1, each of inner bitlines 112, 114, 116, and 118, and outer bitlines 122, 124, 126, and 128 may be coupled to a shared column multiplexer (mux) 132. Each of the outer bitlines may be implemented as part of an integrated circuit in a manner that they "fly over" or "fly under" the inner bitlines. In this way, each of inner bitlines 112, 114, 116, and 118, and outer bitlines 122, 124, 126, and 128 may be coupled to a shared column multiplexer (mux) 132. Memory sub-array 110 may include additional sets of inner bitlines and outer bitlines that may be coupled to respective shared column multiplexers (e.g., column mux 134 and column mux 136). Each of inner bitlines 152, 154, 156, and 158, and outer bitlines 162, 164, 166, and 168 may be coupled to a column multiplexer (mux) 172. Memory sub-array 150 may include additional sets of inner bitlines and outer bitlines that may be coupled to respective shared column multiplexers (e.g., column mux 174 and column mux 176). Both column mux 132 and column mux 172 may be coupled to shared column circuitry 182. Similarly, both column mux 134 and column mux 174 may be coupled to shared column circuitry 184. Moreover, both column mux 136 and column mux 176 may be coupled to shared column circuitry 186. As used herein the term "outer wordlines" includes those memory rows that are spatially further away from the column circuitry (e.g., column circuitry 182, 184, or 186) and the term "inner wordlines" includes those memory rows that are spatially closer to the column circuitry. As used herein the term "outer bitlines" includes those bitlines that have memory cells that are accessed when the "outer wordlines" are fired and the term "inner bitlines" includes those bitlines that have memory cells that are accessed when the "inner wordlines" are fired.

Still referring to FIG. 1, wordline signals may be asserted using row decoders (not shown in FIG. 1), including wordline drivers. Row decoders may decode address signals and assert appropriate wordlines using corresponding wordline drivers. Signals on the bitlines corresponding to the selected columns may be developed using column circuitry (e.g., one of column circuitry 182, 184, and 186). Instead of traditional sense amplifiers, other type of sense elements (e.g., logic gates, including at least one of an inverter, a NOR gate, or a NAND gate) may be used to sense a state of the respective memory cells.

With continued reference to FIG. 1, in terms of the burst mode read operation, in one example, two wordlines in each of the memory sub-arrays may be fired together and the read column select signals address may be sequentially incremented. Thus, in one example, wordlines 120 and 130 in memory sub-array 110 and wordlines 160 and 170 in memory sub-array 150 may be fired together. These wordlines once fired may be held in this state until both inner bitlines and outer bitlines corresponding to each selected column of memory sub-arrays 110 and 150 have output data bits. Advantageously, using this arrangement more data bits may be output per burst read operation while consuming less energy per burst mode read cycle. As an example, as part of the burst mode read operation twice the number of bits may be output with an improved access time. The overall bandwidth (measured in bits/ps) of memory 100 may be approximately 22 percent higher than the bandwidth of conventional memory. As an example, the address decoding time may be saved by decoding an address at the same time for a larger number of data words. At the same time, the energy per bit consumed as part of the burst mode read operation may be approximately 25 percent larger than the energy per bit consumed by a conventional memory. Moreover, the effective bitline loading may be reduced because without the separation of the inner bitlines from the outer bitlines, double the number of memory cells (e.g., 256 cells vs. 128 cells) may be associated with each bitline. The lowered effective bitline loading may further reduce the signal development time on each bitline to approximately 0.6 times the traditional signal development time. Although FIG. 1 shows memory 100 as including a certain number of components arranged in a certain manner, memory 100 may include additional or fewer components, arranged differently.

Figure 2:
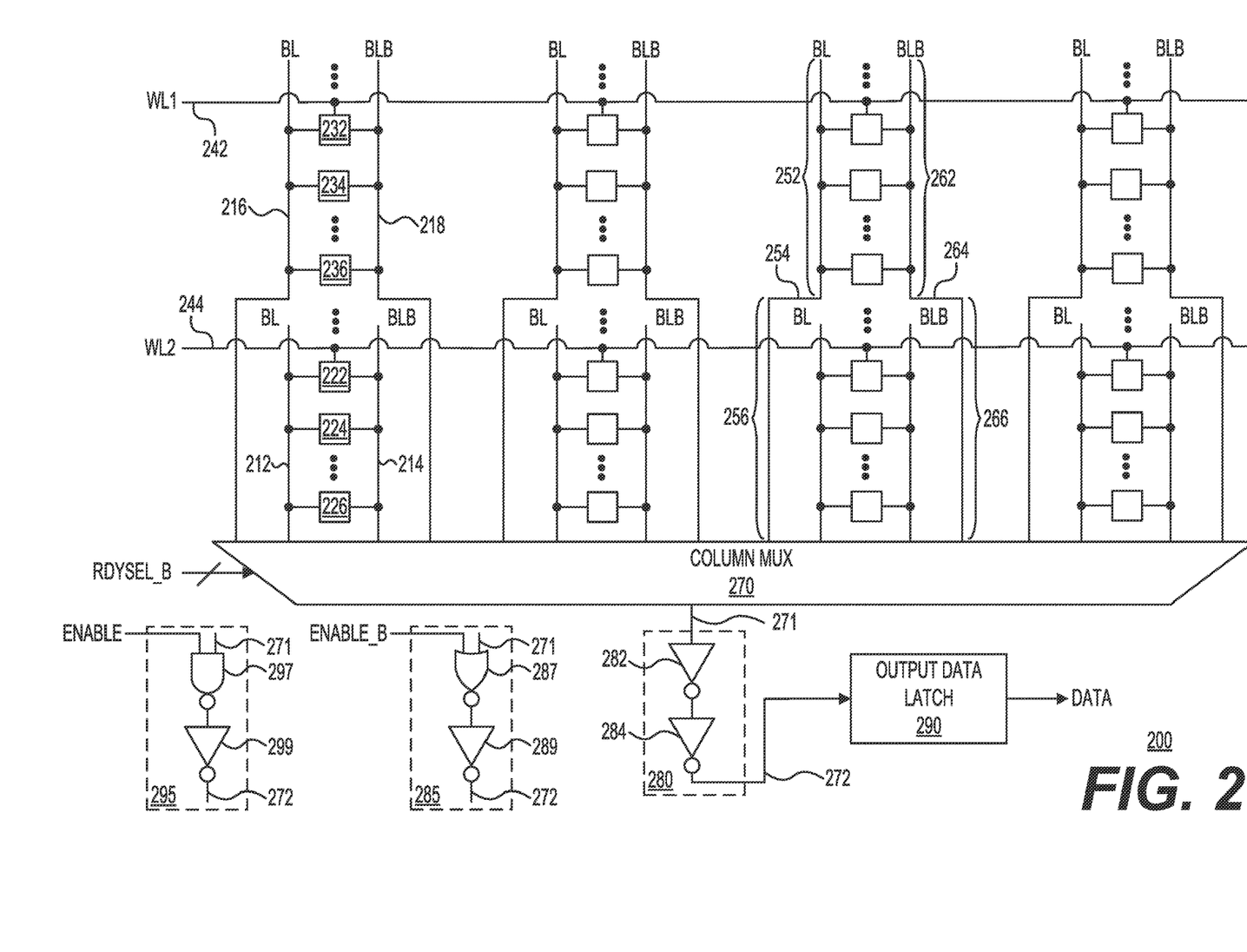
FIG. 2 shows a diagram of a portion of the memory of FIG. 1 in accordance with one example.

FIG. 2 shows a diagram of a portion 200 of memory 100 of FIG. 1 in accordance with one example. Portion 200 shows additional details of a portion of memory sub-array 110 of FIG. 1. As explained earlier with respect to FIG. 1, each memory sub-array that shares column circuitry may include both inner bitlines and outer bitlines. As an example, FIG. 2 shows inner bitlines 212 and 214 and outer bitlines 216 and 218. Memory cells (e.g., static random access memory (SRAM) cells) may be coupled to the bitlines. As an example, in FIG. 2, memory cells 222, 224, and 226 are shown as coupled to inner bitlines 212 and 214 and memory cells 232, 234, and 236 are shown as coupled to outer bitlines 216 and 218. Each row of the memory cells may be driven by a corresponding wordline. FIG. 2 shows wordline (WL1) 242 coupled to the memory cells, including memory cell 232, in an outer row and wordline (WL2) 244 coupled to the memory cells, including memory cell 222, in an inner row. Each memory cell may include cross-coupled inverters and additional transistors. In one example, each memory cell may be implemented as a six transistor (6T) memory cell. Other number of transistors (or other components) arranged differently may also be used. Moreover, the memory technology is not limited to an SRAM, but may also include other types of memories, including phase-change memories and magnetic random access memories.

With continued reference to FIG. 2, each of the outer bitlines (e.g., outer bitlines 216 and 218) may be implemented as part of an integrated circuit in a manner such that at least a portion of such outer bitlines can either "fly over" or "fly under" the corresponding inner bitline (e.g., inner bitlines 212 and 214). In this way, each of inner bitlines 212 and 214 and outer bitlines 216 and 218 may be coupled to a shared column multiplexer (mux) 270, or another shared column circuitry. As shown in FIG. 2, each outer bitline (including both BL and BLB bitlines) may include two portions: a first portion (e.g., each of portions 252 and 262) that is accessed when the outer wordline (e.g., WL1 242) is fired and a second portion (e.g., each of portions 256 and 266) that is accessed when the inner wordline (e.g., WL2 244) is fired. The respective portions of the outer bitlines may be coupled via an interconnect. As an example, portion 252 of the outer bitline (BL) is coupled via interconnect 254 to portion 256 of the outer bitline (BL). Similarly, as an example, portion 262 of the outer bitline (BLB) is coupled via interconnect 264 to portion 266 of the outer bitline (BLB). Interconnects 254 and 264 may be implemented as a jumper or another structure that can electrically connect the two portions of the outer bitlines. Moreover, as shown in FIG. 2, in this example portions 256 and 266 of the outer bitlines are the portions that "fly over" or "fly under" a corresponding inner bitline.

Still referring to FIG. 2, in this example, read column select signals (labeled as RDYSEL_B) may be used to select the appropriate columns associated with the memory for outputting data stored in memory cells. In this example, the read column select signal (RDYSEL_B signal) is shown as asserted when it is logic low as opposed to logic high. In this example, sense element 280 may include two inverters 282 and 284, which may be coupled in series between column mux 270 and output data latch 290. Sense element 280 may sense the signal developing on signal line 271 and may output a value via signal line 272 to output data latch 290. Sense element 280 may work well in burst mode read operations because the bitlines may be discharged at voltages below that which is required for sensing using a traditional sense amplifier. The output bit may be stored in output data latch 290. Once the read column select signals (RDYSEL_B signals) are used to select the columns for reading the data words out, sense element 280 may sense a state of the respective memory cells. Although FIG. 2 shows portion 200 of memory 100 of FIG. 1 as including a certain number of components arranged in a certain manner, memory 100 may include additional or fewer components, arranged differently. As an example, combinations of logic gates other than just inverters may be used as part of sense element 280. An example sense element 285 may include a NOR gate 287 configured to receive a signal via signal line 271 and an ENABLE_B signal. The ENABLE_B signal may be used to control the timing of when the signal received via signal line 271 is provided to inverter 289, which is coupled to receive the output of NOR gate 287. The controlled passing of the signal received via signal line 271 may result in the capture of the signal developing on signal line 271 at the appropriate time. The output of inverter 289 may be coupled via signal line 272 to output data latch 290. Another example sense element 295 may include a NAND gate 297 configured to receive a signal via signal line 271 and an ENABLE signal. The ENABLE signal may be used to control the timing of when the signal received via signal line 271 is provided to inverter 299, which is coupled to receive the output of NAND gate 297. The controlled passing of the signal received via signal line 271 may result in the capture of the signal developing on signal line 271 at the appropriate time. The output of inverter 299 may be coupled via signal line 272 to output data latch 290.

Figure 3:
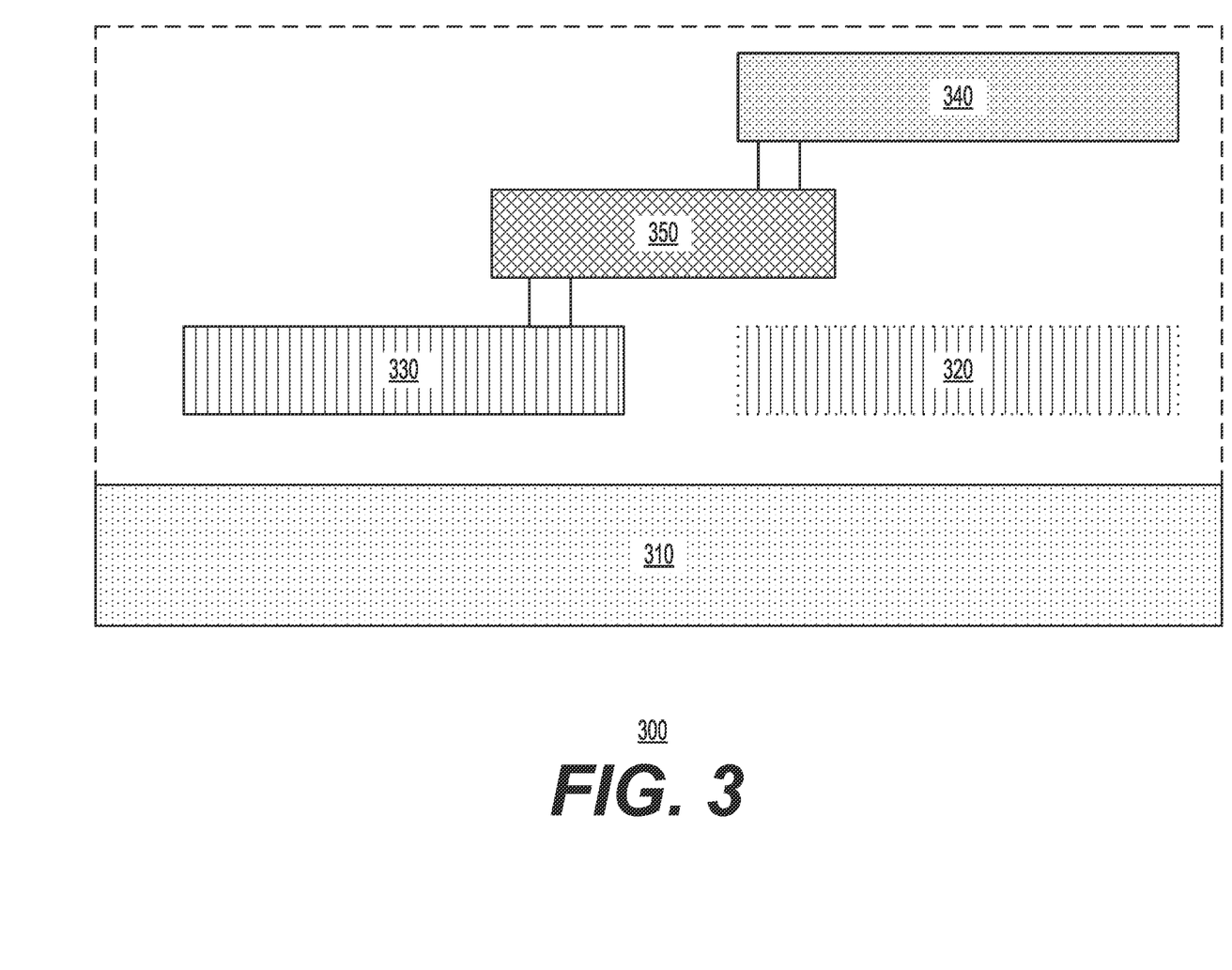
FIG. 3 shows a cross-section view of an implementation of a flying bitline for use in the memory of FIG. 1 in accordance with one example.

FIG. 3 shows a cross-section view 300 of an implementation of a flying bitline for use in memory 100 of FIG. 1 in accordance with one example. Cross-section view 300 shows only a portion of an integrated circuit that may include memory 100. In addition, cross-section view 300 shows only those details that are relevant to the implementation of the flying bitlines for use in memory 100 of FIG. 1. An integrated circuit having memory 100 may include a substrate 310. Substrate 310 may correspond to a die associated with the integrated circuit. Using semiconductor processing techniques various layers, including metal layers, dielectric layers, and other layers, may be formed. In this example, a cross-section view 320 of one of the inner bitlines (e.g., bitline 212 of FIG. 2), which may be formed in metal layer M0, is shown. Cross-section view 320 is shown as dotted because the inner bitline may not be visible in the same plane as a cross-section of the outer bitline. In addition, a cross-section view 330 of a portion of one of the outer bitlines (e.g., portion 252 of an outer bitline similar to outer bitline 216 of FIG. 2), which may also be formed in metal layer M0 at least partially, is shown. A cross-section view 340 of a portion of the outer bitline is shown as flying over the cross-section view 320 of the inner bitline. In this example, the flying portion of outer bitline may be formed in a metal layer M2. In addition, cross-section view 350 shows part of an interconnecting structure (e.g., a jumper) to connect the two portions of the outer bitline. Vias or other mechanisms may be used to connect the portion of outer bitline formed in metal layer M0 with the portion of the outer bitline formed in metal layer M2. Although FIG. 3 shows a certain arrangement of layers and interconnections among them, flying bitlines may be formed using a different arrangement of layers having different interconnections. As an example, although FIG. 3 shows an outer bitline that is "flying over" the inner bitline, the outer bitline may also be formed to "fly under" the inner bitline. In addition, the bitlines need not be directly under or over each other, and they may be offset from each other.

Figure 4:
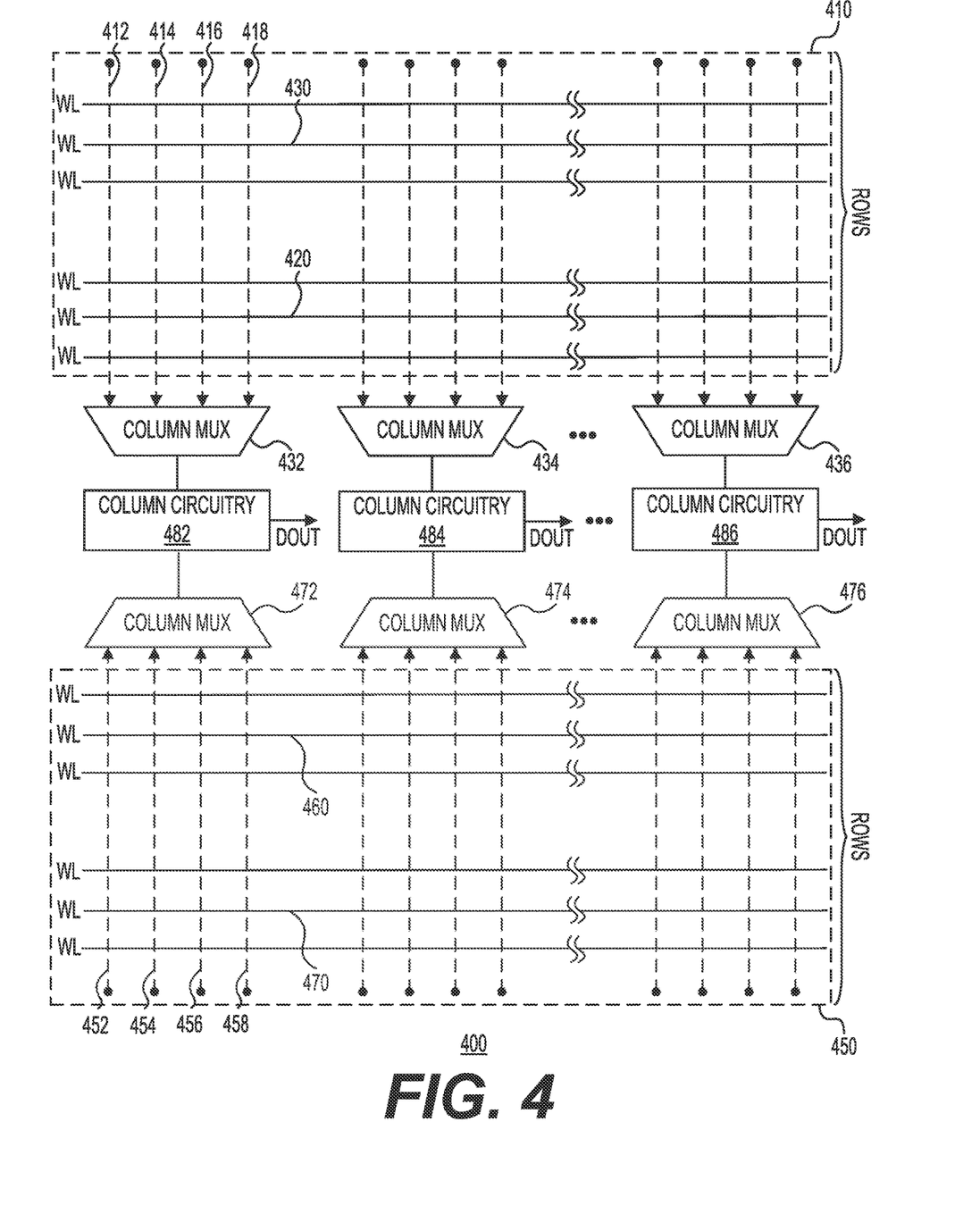
FIG. 4 shows a schematic diagram of another memory having a sense element, not including a sense amplifier, in accordance with one example.

FIG. 4 shows a schematic diagram of another memory 400 having a sense element, not including a sense amplifier, in accordance with one example. Memory 400 may include memory sub-array 410 and memory sub-array 450. Memory sub-array 410 may include a set of wordlines (WLs) corresponding to the rows in memory sub-array 410 (e.g., wordline 420 and wordline 430). Memory sub-array 410 may further include a set of bitlines 412, 414, 416, and 418. Similarly, memory sub-array 450 may include a set of wordlines (WLs) (e.g., wordline 460 and wordline 470). Memory sub-array 450 may further include a set of bitlines 452, 454, 456, and 458. In one example, during a burst read operation each of wordline 420 or 430 of memory sub-array 410 and each of wordline 460 or 470 of memory sub-array 450 may be simultaneously asserted to allow for access to memory cells connected to bitlines of each of the memory sub-arrays.

With continued reference to FIG. 4, each of bitlines 412, 414, 416, and 418 may be coupled to a shared column multiplexer (mux) 432. Memory sub-array 410 may include additional sets of bitlines that may be coupled to respective shared column multiplexers (e.g., column mux 434 and column mux 436). Each of bitlines 452, 454, 456, and 458 may be coupled to a column multiplexer (mux) 472. Memory sub-array 450 may include additional sets of bitlines that may be coupled to respective shared column multiplexers (e.g., column mux 474 and column mux 476). Both column mux 432 and column mux 472 may be coupled to shared column circuitry 482. Similarly, both column mux 434 and column mux 474 may be coupled to shared column circuitry 484. Moreover, both column mux 436 and column mux 476 may be coupled to shared column circuitry 486.

Still referring to FIG. 4, wordline signals may be asserted using row decoders (not shown in FIG. 4), including wordline drivers. Row decoders may decode address signals and assert appropriate wordlines using corresponding wordline drivers. Bitline signals may be asserted using column circuitry (e.g., one of column circuitry 482, 484, and 486).

With continued reference to FIG. 4, in terms of the burst mode read operation, in one example, one wordline in each of the memory sub-arrays may be fired together and the read column select signals address may be sequentially incremented. Thus, in one example, wordline 420 or 430 in memory sub-array 410 and wordline 460 or 470 in memory sub-array 450 may be fired together. These wordlines once fired may be held in this state until bitlines corresponding to each selected column of memory sub-arrays 410 and 450 have output data bits. Advantageously, using this arrangement more data bits may be output per burst read operation while consuming less energy per burst mode read cycle. As an example, as part of the burst mode read operation twice the number of bits may be output with an improved access time. Although FIG. 4 shows memory 400 as including a certain number of components arranged in a certain manner, memory 400 may include additional or fewer components, arranged differently.

Figure 5:
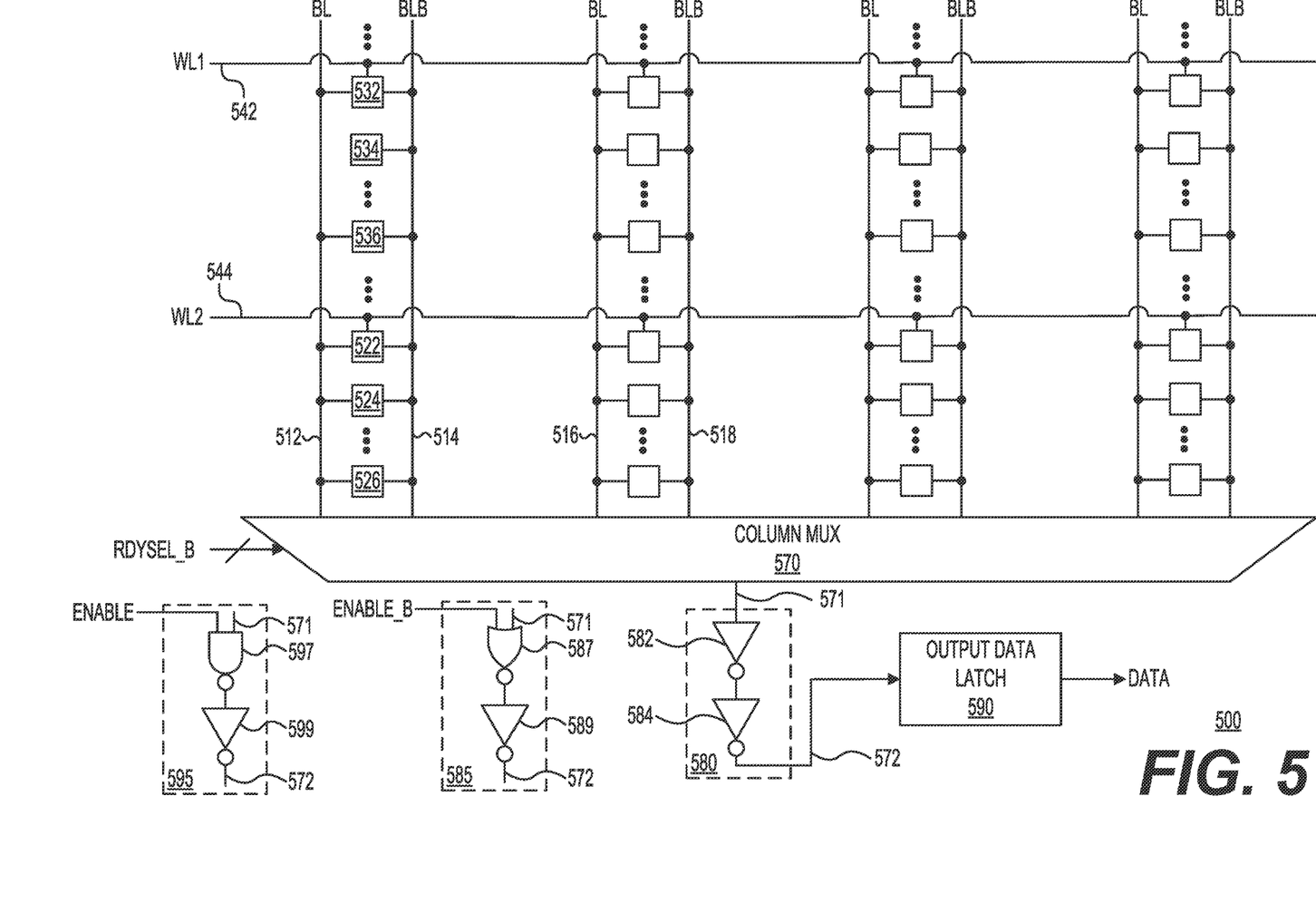
FIG. 5 shows a diagram of a portion of the memory of FIG. 4 in accordance with one example.

FIG. 5 shows a diagram of a portion 500 of memory 400 of FIG. 4 in accordance with one example. Portion 500 shows additional details of a portion of memory sub-array 410 of FIG. 4. As explained earlier with respect to FIG. 4, each memory sub-array that shares column circuitry may include bitlines, such as bitlines 512, 514, 516, and 518. Wordlines (e.g., WL1 542 and WL2 544) may be coupled to memory cells. Memory cells (e.g., static random access memory (SRAM) cells) may be coupled to the bitlines. As an example, in FIG. 5, memory cells 522, 524, 526, 532, 534, and 536 are shown as coupled to bitlines 512 and 514. Each row of the memory cells may be driven by a corresponding wordline. Each memory cell may include cross-coupled inverters and additional transistors. In one example, each memory cell may be implemented as a six transistor (6T) memory cell. Other number of transistors (or other components) arranged differently may also be used. Moreover, the memory technology is not limited to an SRAM, but may also include other types of memories, including phase-change memories and magnetic random access memories.

Still referring to FIG. 5, in this example, read column select signals (labeled as RDYSEL_B) may be used to select the appropriate columns associated with the memory for outputting data stored in memory cells. In this example, the read column select signal (RDYSEL_B signal) is shown as asserted when it is logic low as opposed to logic high. In this example, sense element 580 may include two inverters 582 and 584, which may be coupled in series between column mux 570 and output data latch 590. Sense element 580 may sense the signal developing on signal line 571 and may output a value via signal line 572 to output data latch 590. Sense element 580 may work well in burst mode read operations because the bitlines may be discharged at voltages below that is required for sensing using a traditional sense amplifier. Although FIG. 5 shows portion 500 of memory 400 of FIG. 4 as including a certain number of components arranged in a certain manner, memory 400 may include additional or fewer components, arranged differently. As an example, combinations of logic gates other than just inverters may be used as part of sense element 580. An example sense element 585 may include a NOR gate 587 configured to receive a signal via signal line 571 and an ENABLE_B signal. The ENABLE_B signal may be used to control the timing of when the signal received via signal line 571 is provided to inverter 589, which is coupled to receive the output of NOR gate 587. The controlled passing of the signal received via signal line 571 may result in the capture of the signal developing on signal line 571 at the appropriate time. The output of inverter 589 may be coupled via signal line 572 to output data latch 590. Another example sense element 595 may include a NAND gate 597 configured to receive a signal via signal line 571 and an ENABLE signal. The ENABLE signal may be used to control the timing of when the signal received via signal line 571 is provided to inverter 599, which is coupled to receive the output of NAND gate 597. The controlled passing of the signal received via signal line 571 may result in the capture of the signal developing on signal line 571 at the appropriate time. The output of inverter 599 may be coupled via signal line 572 to output data latch 590.

Figure 6:
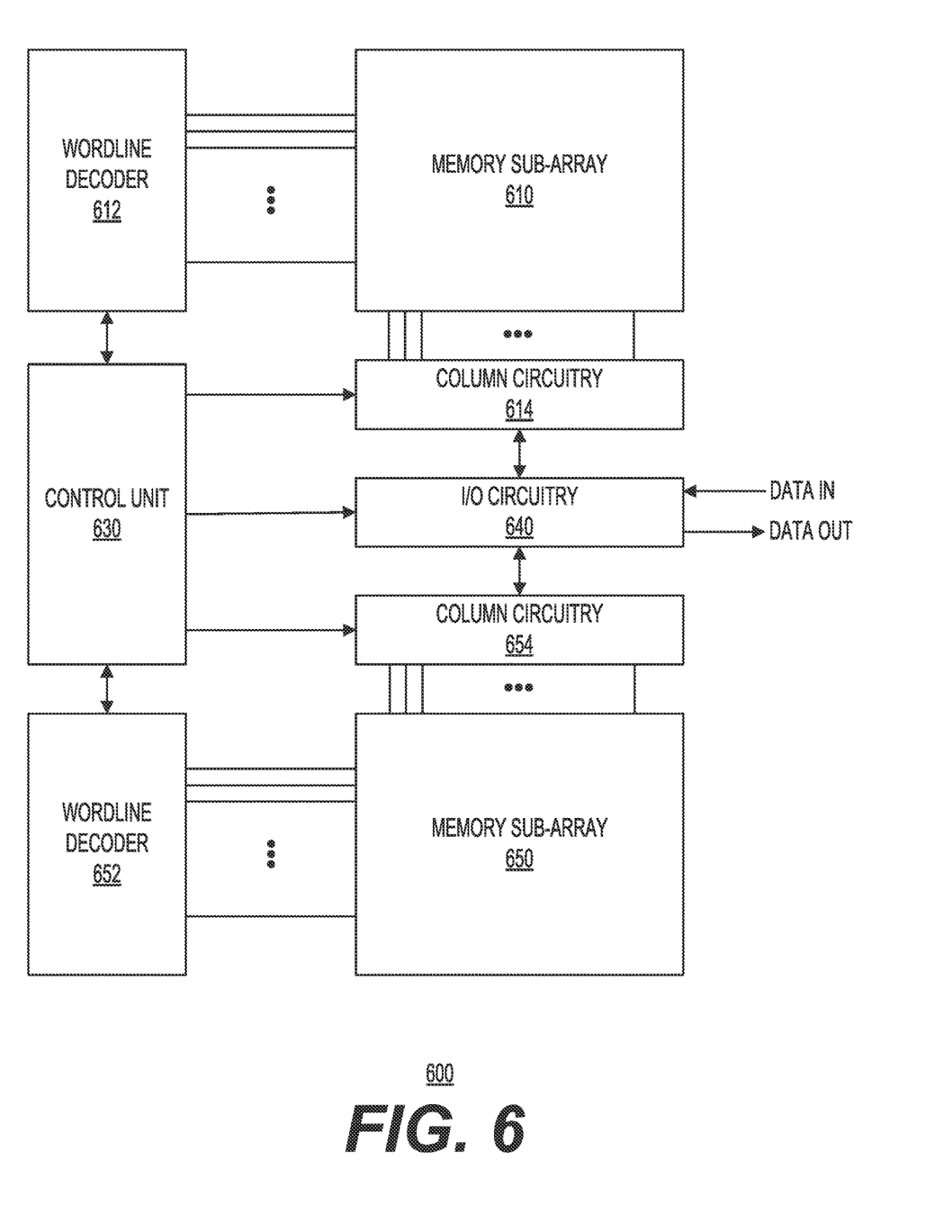
FIG. 6 shows a diagram of a memory system including the memory of FIG. 1 or the memory of FIG. 4.

FIG. 6 shows a diagram of a memory system 600 including either memory 100 of FIG. 1 or memory 400 of FIG. 4. Memory system 600 may be included as an SRAM in an integrated circuit having one or more processing cores. Such an integrated circuit may be implemented as a central processing unit (CPU) (single or multi-core), a graphics processing unit (GPU), or a field programmable gate array (FPGA). Memory system 600 may be implemented as a block RAM (BRAM) as part of an FPGA. Memory system 600 may also be implemented as a standalone memory system. Alternatively, memory system 600 may be integrated with logic as part of a 3D-stacked system (e.g., a high bandwidth memory (HBM) system). Memory system 600 may include two memory sub-arrays: memory sub-array 610 and memory sub-array 650 arranged in the manner shown in FIG. 6. Memory system 600 may further include a wordline decoder 612 coupled to memory sub-array 610 and another wordline decoder 652 coupled to memory sub-array 650. Column circuitry 614 may be coupled to memory sub-array 610 to interface with the bitlines (both inner and outer bitlines when memory 100 is included as part of memory system 600) included in memory sub-array 610. Similarly, column circuitry 654 may be coupled to memory sub-array 650 to interface with the bitlines (both inner and outer bitlines when memory 100 is included as part of memory system 600) included in memory sub-array 650. I/O circuitry 640 may be coupled to both column circuitry 614 and column circuitry 654. Memory system 600 may further include a control unit 630, which may be coupled to at least wordline decoder 612, wordline decoder 652, column circuitry 614, column circuitry 654, and I/O circuitry 640.

Figure 7:
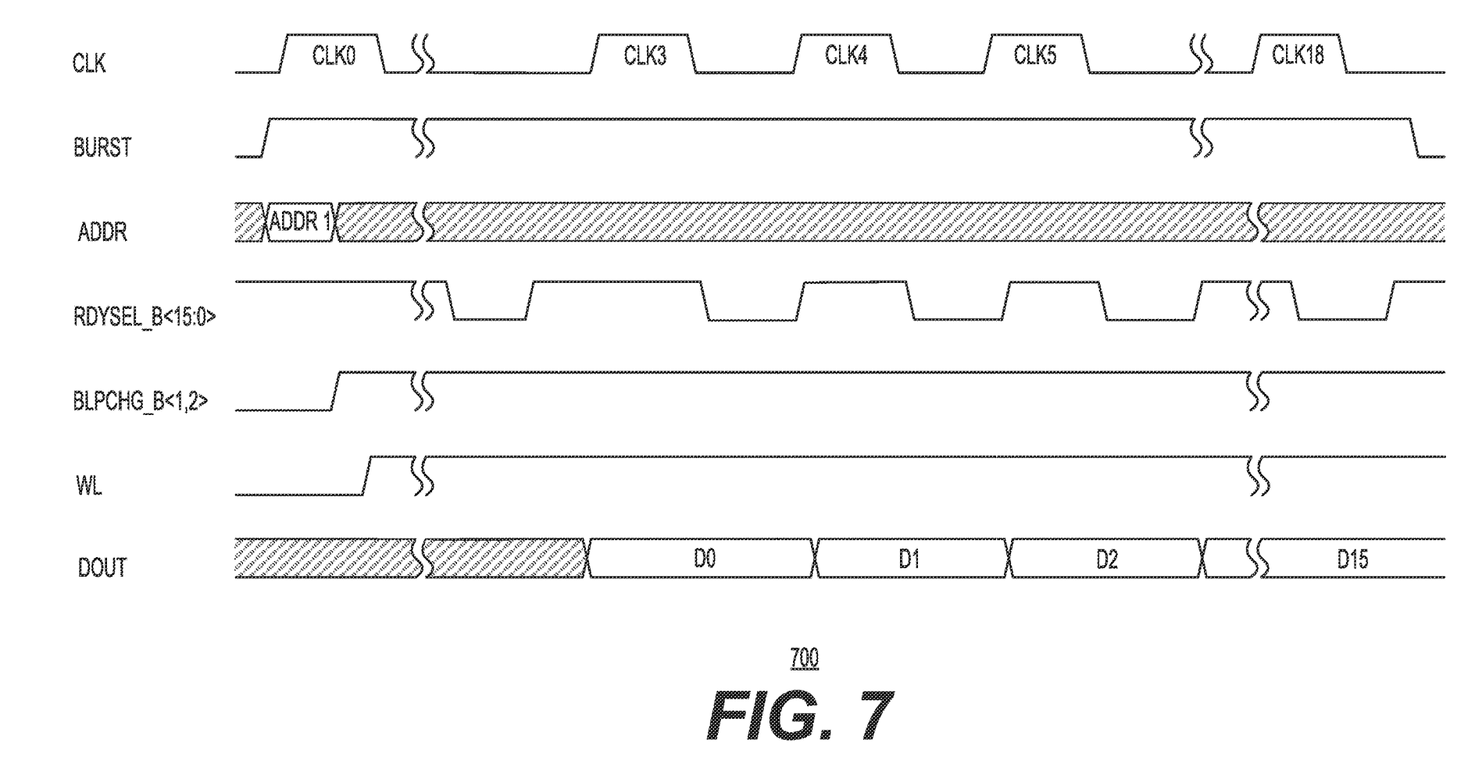
FIG. 7 shows waveforms associated with the burst mode read performed using the memory system of FIG. 6 in accordance with one example.

With continued reference to FIG. 6, control unit 630 may generate control signals for controlling the operation of various components of memory system 400. As an example, control unit 630 may process any read/write signals, burst mode signals, and addresses. In one example, control unit 630 may include timing circuitry, finite state machines, and other logic to allow for the generation of appropriate control signals. As an example, control unit 630 may generate control signals, which (directly or indirectly) may generate other signals resulting in the burst mode operation described further with respect to FIG. 7. Although FIG. 6 shows memory system 600 as including a certain number of components arranged in a certain manner, memory system 600 may include additional or fewer components, arranged differently. As an example, control unit 630 may be configured to allow memory system 600 to operate in multiple different burst modes. In one burst mode, two wordlines per memory sub-array (e.g., memory sub-arrays 610 and 650) may be simultaneously asserted to output data from the memory cells. Alternatively, in a second burst mode, only two wordlines for one of the memory sub-arrays (e.g., one of memory sub-arrays 610 and 650) may be activated at a time. The other two wordlines for the other memory sub-array (e.g., another one of memory sub-arrays 610 and 650) may be activated immediately after outputting the data from the first memory sub-array. As part of a third burst mode, one wordline per memory sub-array (e.g., memory sub-array 610 or 650) may be asserted at a time until all four wordlines corresponding to the two memory sub-arrays have been asserted sequentially. The data words may still be output as part of a single burst, FIG. 7 shows waveforms 700 associated with the burst mode read performed using memory system 600 of FIG. 6 in accordance with one example. As explained earlier memory system 600 may include memory sub-arrays with both inner and outer bitlines that are configured to output bits in response to the simultaneous assertion of two wordlines per memory sub-array. Alternatively, memory system 600 may include memory sub-arrays with bitlines that are configured to output bits in response to the simultaneous assertion of one wordline per memory sub-array. Memory system 600 may be configured to output a certain number of data words per burst mode cycle. The operation of memory system 600 explained with respect to FIG. 7 assumes that memory system 600 is configured to output 16 data words (from both inner bitlines and outer bitlines) in response to a burst mode read operation request. The size of each of the data words that is output may depend on the number of columns per memory sub-array. Waveforms 700 show internal waveforms corresponding to the operation of memory system 600, including memory 100 of FIG. 1. Waveforms 700 show a clock signal (CLK) associated with memory system 600. This clock signal may be used to coordinate the timing of the assertion and de-assertion of the various signals associated with memory system 600. Waveforms 700 further show a burst mode signal (BURST), which may be processed by control unit 630 associated with memory system 600. In addition, waveforms 700 show the providing of an address (ADDR) for the data (e.g., ADDR1) to be read in the burst mode. In this example, the assertion of the BURST signal indicates to control unit 630 that the read operation is a burst mode read operation as opposed to a non-burst mode operation. In response, control unit 630 may activate logic, including finite state machine(s) and timers, to control the internal timing of the other signals associated with memory system 600.

With continued reference to FIG. 7, in response to the burst mode signal (BURST) and the address (ADDR1), control unit 630 may determine which of the two wordlines need to be fired for each of the memory sub-arrays (e.g., two wordlines for memory sub-array 610 and two wordlines for memory sub-array 650). Prior to firing the wordlines, control unit 630 may precharge both the inner bitlines and the outer bitlines by asserting bitline precharge signals (the waveform labeled as BLPCHG_B<1,2> in FIG. 7) for both memory sub-array 610 and memory sub-array 650. In this example the bitline precharge signals are shown as asserted when the signals are logic low as opposed to logic high. Once precharged, the bitline precharge signals for the two sub-arrays are de-asserted as shown in FIG. 7 and the appropriate wordline signals are simultaneously asserted. In one example, the address (ADDR1) may include at least two address bits for the selection of the appropriate wordlines. The wordline decoders (e.g., wordline decoder 612 and wordline decoder 652) may fire the appropriate wordlines. In this example, control unit 630 may provide control signals to the wordline decoders to control the timing of the assertion of the wordline signals. As an example, control unit 630 may assert control signals that may fire the wordlines after a certain time has elapsed since the de-assertion of the bitline precharge signals (BLPCHG_B<1,2>). For ease of depiction, although waveforms 700 show the firing of a single wordline (WL), in this example, four wordlines are fired simultaneously—two wordlines corresponding to memory sub-array 610 and two wordlines corresponding to memory sub-array 650.

Advantageously, in the burst mode read operation multiple words can be output without having to re-fire the wordlines. This is because the wordline signals are kept asserted for the duration of the burst to ensure that both the inner bitlines and the outer bitlines that are being accessed are actively held during the burst read operation.

Still referring to FIG. 7, the column-select signals that allow reading of memory cells coupled to both inner bitlines and outer bitlines corresponding to both memory sub-array 610 and memory sub-array 650 may be asserted sequentially to read one data word at a time. Read column select signals (labeled as RDYSEL_B<15:0>) show example signals generated by control unit 630 to select the appropriate columns associated with memory system 600 for outputting data stored in memory cells. In this example, unlike the other signals, the read column select signal (RDYSEL_B signal) is shown as asserted when it is logic low as opposed to logic high. Once the read column select signals (RDYSEL_B<15: 0> signals) are used to select the columns for reading the data words out. In one example, control unit 630 may control the sense elements (e.g., sense element 280 of FIG. 2) to read data bits out of respective memory cells.

With continued reference to FIG. 7, after data word D0 is output (shown as being output as part of the waveform labeled as DOUT), every clock cycle (e.g., clock cycle CLK3, CLK4, . . . CLK18), another data word (e.g., data words D1, D2, . . . D15) may be output by memory system 600. As explained earlier, while the replacement of the sense amplifier with sense elements requires the development of a large signal on the bitlines, after the bitline signal has been developed, the read out is faster. This results in a better performance in the burst mode where multiple data words can be output once the bitline signals have been developed. Although FIG. 7 shows waveforms corresponding to a memory system in which the first data word is output in a certain time (e.g., three clock cycles) after the receipt of an address associated with a burst mode read operation, alterations to the memory system may result in an increased or a lowered number of clock cycles for the first data word to be output after the receipt of the address. In addition, depending on the size of the memory arrays, additional or fewer data words per burst mode read operation may be output. In addition, memory system 600 may be operated in a normal mode (e.g., when the burst mode signal (BURST) is not asserted by the processing logic issuing the read request) in which only one or two data words are output per read request.

Figure 8:
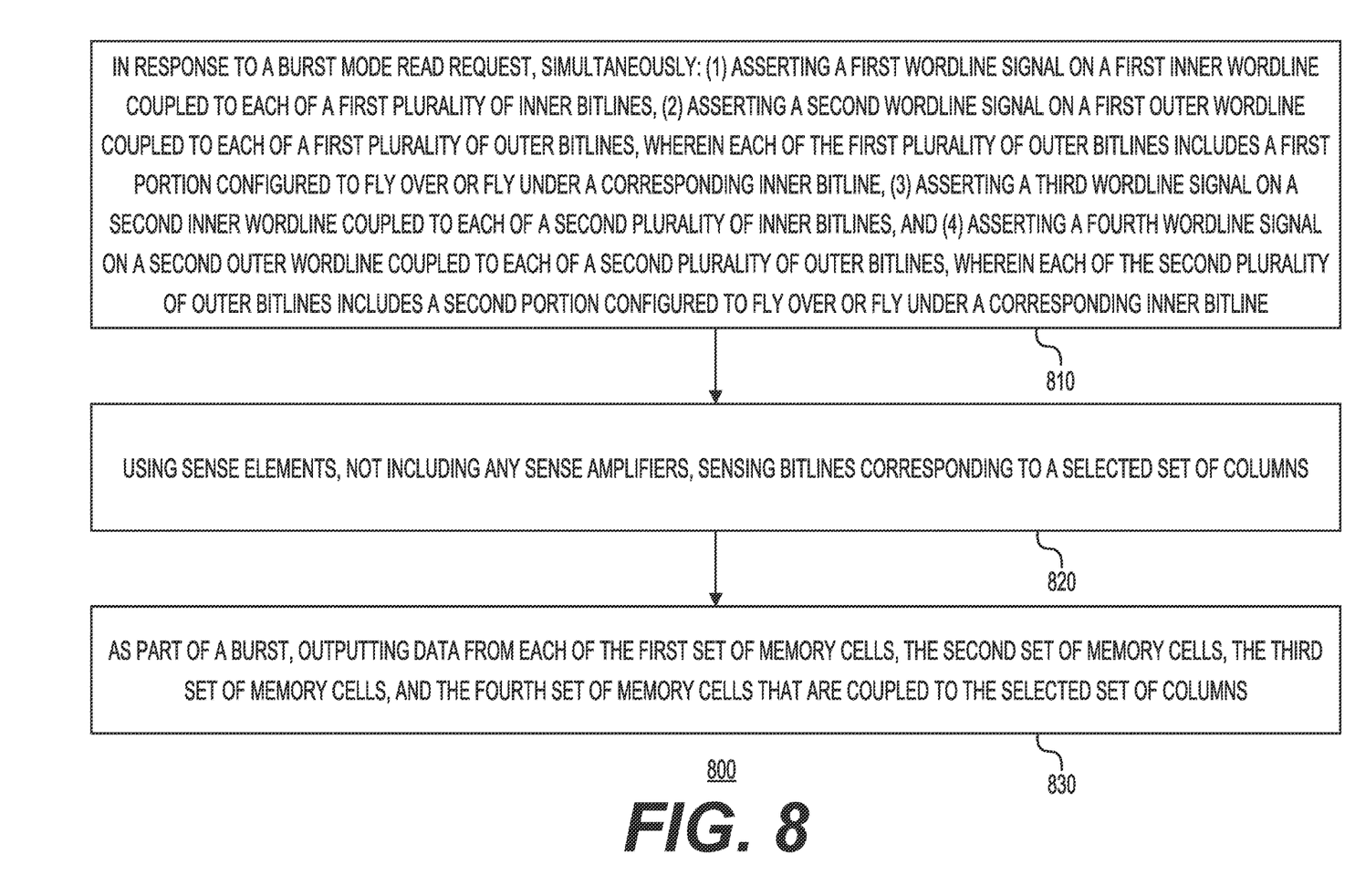
FIG. 8 shows a flow chart of a method for performing a burst mode read using the memory system of FIG. 6 in accordance with an example.

FIG. 8 shows a flow chart 800 of a method for performing a burst mode read using memory system 600 of FIG. 6 in accordance with an example. In one example, the steps described with respect to flow chart 800 may be performed in response (direct or indirect) to the assertion of control signals associated with memory system 600 (e.g., the control signals generated by control unit 630 of FIG. 6). Step 810 may include in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, where each of the second plurality of outer bitlines includes a second portion configured to fly over or fly under a corresponding inner bitline. As explained earlier, the burst mode request may include asserting the signal labeled BURST in FIG. 7. In response, multiple wordlines (e.g., two wordlines associated with memory sub-array 610 of FIG. 6 and two wordlines associated with memory sub-array 650 of FIG. 6) may be asserted based on control signals from control unit 630.

Step 820 may include using sense elements, not including any sense amplifiers, sensing bitlines corresponding to a selected set of columns. As explained earlier with respect to FIGS. 2 and 5, sense elements (e.g., sense element 280 and sense element 580) may be used to sense bitlines corresponding to the selected set of columns.

Step 830 may include outputting data from each of the first set of memory cells, the second set of memory cells, the third set of memory cells, and the fourth set of memory cells as part of a burst. Further details regarding the outputting step are provided with respect to FIGS. 6 and 7. As an example, FIG. 7 shows the DOUT waveform indicating multiple data words being output as part of the burst.

In conclusion, in one example, the present disclosure relates to a method for operating a memory system comprising a first memory sub-array and a second memory sub-array, where the first memory sub-array includes a first set of memory cells coupled to a first inner wordline and a second set of memory cells coupled to a first outer wordline, and where the second memory sub-array includes a third set of memory cells coupled to a second inner wordline and a fourth set of memory cells coupled to a second outer wordline. The method may include in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, where each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, where each of the second plurality of outer bitlines includes a second portion configured to fly over or fly under a corresponding inner bitline. The method may further include using sense elements, not including any sense amplifiers, sensing bitlines corresponding to a selected set of columns. The method may further include as part of a burst, outputting data from each of the first set of memory cells, the second set of memory cells, the third set of memory cells, and the fourth set of memory cells that are coupled to the selected set of columns.

Each of the sensing elements may include at least one logic gate comprising at least one of an inverter, a NOR gate, or a NAND gate. Each of the first set of memory cells and the second set of memory cells may be organized in a first plurality of columns, and the method may further comprise selecting one column at a time from among the first plurality of columns in response to an assertion of a read column select signal for outputting the data as part of the burst. Each of the third set of memory cells and the fourth set of memory cells may be organized in a second plurality of columns, and the method may further comprise selecting one column at a time from among the second plurality of columns in response to an assertion of a read column select signal for outputting the data as part of the burst.

The memory system may be formed as part of an integrated circuit, where each of the first plurality of inner bitlines and the second plurality of inner bitlines may be formed in a first metal layer associated with the integrated circuit, and where each of the first portion configured to fly over or fly under the corresponding inner bitline and the second portion may be configured to fly over or fly under the corresponding inner bitline is formed in a second metal layer, different from the first metal layer. Each of the first plurality of outer bitlines may include a second portion formed in the first metal layer, and the first portion configured to fly over or fly under the corresponding inner bitline may be coupled to the second portion formed in the first metal layer via an interconnect. Each of the second plurality of outer bitlines may include a second portion formed in the first metal layer, and the second portion configured to fly over or fly under the corresponding inner bitline may be coupled to the second portion formed in the first metal layer via an interconnect.

The memory system may comprise a control unit. The method may further comprise the control unit generating control signals in response to a receipt of an address associated with the burst mode read request and a burst mode signal. The memory system may further comprise a first wordline decoder associated with the first memory sub-array and a second wordline decoder associated with the second memory sub-array, and the method may further comprise the control unit controlling a timing of an assertion of wordline signals by both the first wordline decoder and the second wordline decoder.

In another example, the present disclosure relates to a memory system including a memory array including a first set of memory cells coupled to a first wordline and a second set of memory cells coupled to a second wordline. The memory system may further include a plurality of sense elements, not including any sense amplifiers, coupled to a plurality of columns such that each of the plurality of columns has a corresponding sense element. The control unit may be configured to generate control signals for: in response to a burst mode read request, simultaneously: (1) asserting a first wordline signal on the first wordline coupled to each of a plurality of first set of bitlines, and (2) asserting a second wordline signal on the second wordline coupled to each of a plurality of second set of bitlines, and as part of a burst, outputting data corresponding to a subset of each of the first set of memory cells and the second set of memory cells sensed by a selected set of the plurality of sense elements corresponding to a selected set of the plurality of columns.

Each of the first set of memory cells and the second set of memory cells may be organized in a plurality of columns, and the control unit may further be configured to generate control signals for selecting one column at a time from among the plurality of columns in response to an assertion of a read column select signal for outputting the data as part of the burst. Each of the plurality of sensing elements may include at least one logic gate comprising at least one of an inverter, a NOR date, or a NAND gate.

In yet another example, the present disclosure relates to a memory system including a first memory sub-array and a second memory sub-array, where the first memory sub-array includes a first set of memory cells coupled to a first inner wordline and a second set of memory cells coupled to a first outer wordline, where the second memory sub-array includes a third set of memory cells coupled to a second inner wordline and a fourth set of memory cells coupled to a second outer wordline, where each of the first set of memory cells and the second set of memory cells is organized in a first plurality of columns, and where each of the third set of memory cells and the fourth set of memory cells is organized in a second plurality of columns. The memory system may further include a plurality of sense elements, not including any sense amplifiers, coupled to a plurality of columns such that each of the plurality of columns has a corresponding sense element. The control unit may be configured to generate control signals for: in a first burst mode; in response to a first burst mode read request; simultaneously: (1) asserting a first wordline signal on the first inner wordline coupled to each of a first plurality of inner bitlines, (2) asserting a second wordline signal on the first outer wordline coupled to each of a first plurality of outer bitlines; where each of the first plurality of outer bitlines includes a first portion configured to fly over or fly under a corresponding inner bitline, (3) asserting a third wordline signal on the second inner wordline coupled to each of a second plurality of inner bitlines, (4) asserting a fourth wordline signal on the second outer wordline coupled to each of a second plurality of outer bitlines, where each of the second plurality of outer bitlines includes a second portion configured to fly over or fly under a corresponding inner bitline, and using the shared column circuitry, and outputting data from each of the first set of memory cells, the second set of memory cells, the third set of memory cells, and the fourth set of memory cells as part of a burst, or in a second burst mode, in response to a second burst mode read request, simultaneously: (1) asserting a first wordline signal on the first inner wordline coupled to each of a first plurality of inner bitlines, and (2) asserting a second wordline signal on the first outer wordline coupled to each of a first plurality of outer bitlines, where each of the first plurality of outer bitlines includes a first portion configured to fly over or fly under a corresponding inner bitline, and outputting data from each of the first set of memory cells and the second set of memory cells.

Each of the plurality of sense elements may include at least one logic gate comprising at least one of an inverter, a NOR gate, or a NAND gate. The control unit may further be configured to generate control signals for selecting one column at a time from among the first plurality of columns in response to an assertion of a read column select signal for outputting the data as part of the burst. The control unit may further be configured to generate control signals for selecting one column at a time from among the second plurality of columns in response to an assertion of a read column select signal for outputting the data as part of the burst.

The memory system may further include a plurality of sense elements coupled to the first plurality of columns and the second plurality of columns such that each of the first plurality of columns and the second plurality of columns has a corresponding shared sense element from among the plurality of sense elements. The memory system may be formed as part of an integrated circuit, where each of the first plurality of inner bitlines and the second plurality of inner bitlines may be formed in a first metal layer associated with the integrated circuit, and where each of the first portion configured to fly over or fly under the corresponding inner bitline and the second portion configured to fly over or fly under the corresponding inner bitline may be formed in a second metal layer, different from the first metal layer.

Each of the first plurality of outer bitlines may include a second portion formed in the first metal layer, and the first portion configured to fly over or fly under the corresponding inner bitline may be coupled to the second portion formed in the first metal layer via an interconnect. Each of the second plurality of outer bitlines may include a second portion formed in the first metal layer, and the second portion configured to fly over or fly under the corresponding inner bitline may be coupled to the second portion formed in the first metal layer via an interconnect. The memory system may further comprise a data latch for latching data sensed by any of the plurality of sense elements It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a system, or any other implementation of a functionality, is described herein as being coupled to another component does not mean that the components are necessarily separate components. As an example, a component A described as being coupled to another component B may be a sub-component of the component B, or the component B may be a sub-component of the component A.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method for operating a memory system comprising a first memory sub-array and a second memory sub-array, wherein the first memory sub-array includes a first set of memory cells coupled to a first inner wordline and a second set of memory cells coupled to a first outer wordline, and wherein the second memory sub-array includes a third set of memory cells coupled to a second inner wordline and a fourth set of memory cells coupled to a second outer wordline, the method comprising:

in a first burst mode, in response to a first burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, wherein each of the first plurality of outer bitlines includes a first portion configured to fly over or fly under a corresponding inner bitline, (3) asserting a third wordline signal on the second inner wordline coupled to each of a second plurality of inner bitlines, and (4) asserting a fourth wordline signal on the second outer wordline coupled to each of a second plurality of outer bitlines, wherein each of the second plurality of outer bitlines includes a second portion configured to fly over or fly under a corresponding inner bitline;

in a second burst mode, different from the first burst mode, in response to a second mode read request, simultaneously: (1) asserting a fifth wordline signal on the first inner wordline coupled to each of the first plurality of inner bitlines, and (2) asserting a sixth wordline signal on the first outer wordline coupled to each of the first plurality of outer bitlines, wherein each of the first plurality of inner bitlines, each of the second plurality of inner bitlines, each of the first plurality of outer bitlines, and each of the plurality of the second outer bitlines is coupled to a shared column multiplexer;

using at least one sense element comprising a plurality of inverters coupled in series between the shared column multiplexer and an output data latch, sensing bitlines corresponding to a selected set of columns; and as part of a burst, depending upon whether the memory system is operating in the first burst mode or the second burst mode, selectively outputting data into the output data latch from the first set of memory cells, the second set of memory cells, the third set of memory cells, and the fourth set of memory cells that are coupled to the selected set of columns.

2. The method of claim 1, wherein the at least one sense element further includes at least one logic gate comprising at least one of a NOR gate or a NAND gate.

3. The method of claim 1, wherein each of the first set of memory cells and the second set of memory cells is organized in a first plurality of columns, and wherein the method further comprises selecting one column at a time from among the first plurality of columns in response to an assertion of a read column select signal for outputting the data as part of the burst.

4. The method of claim 3, wherein each of the third set of memory cells and the fourth set of memory cells is organized in a second plurality of columns, and wherein the method further comprises selecting one column at a time from among the second plurality of columns in response to an assertion of a read column select signal for outputting the data as part of the burst.

5. The method of claim 1, wherein the memory system is formed as part of an integrated circuit, wherein each of the first plurality of inner bitlines and the second plurality of inner bitlines is formed in a first metal layer associated with the integrated circuit, and wherein each of the first portion configured to fly over or fly under a corresponding inner bitline and the second portion configured to fly over or fly under a corresponding inner bitline is formed in a second metal layer, different from the first metal layer.

6. The method of claim 5, wherein each of the first plurality of outer bitlines includes a second portion formed in the first metal layer, and wherein the first portion configured to fly over or fly under the corresponding inner bitline is coupled to the second portion formed in the first metal layer via an interconnect.

7. The method of claim 6, wherein each of the second plurality of outer bitlines includes a second portion formed in the first metal layer, and wherein the second portion configured to fly over or fly under the corresponding inner bitline is coupled to the second portion formed in the first metal layer via an interconnect.

8. The method of claim 1, wherein the memory system comprises a first wordline decoder associated with the first memory sub-array and a second wordline decoder associated with the second memory sub-array, wherein the method further comprising the control unit controlling a timing of an assertion of wordline signals by both the first wordline decoder and the second wordline decoder.

9. A memory system comprising:
a first memory array including a first set of memory cells coupled to a first inner wordline and a second set of memory cells coupled to a first outer wordline;
a second memory array including a third set of memory cells coupled to a second inner wordline and a fourth set of memory cells coupled to a second outer wordline;
a plurality of sense elements coupled to a plurality of columns such that each of the plurality of columns has a corresponding sense element, wherein the plurality of columns is coupled to a shared column multiplexer, and wherein each of the plurality of sense elements comprises a plurality of inverters coupled in series between an output data latch and the shared column multiplexer; and
a control unit configured to generate control signals for:
in response to a burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, wherein each of the first plurality of outer bitlines includes a first portion configured to fly over or fly under a corresponding inner bitline (3) asserting a third wordline signal on the second inner wordline coupled to each of a second plurality of inner bitlines, and (4) asserting a fourth wordline signal on the second outer wordline coupled to each of a second plurality of outer bitlines, wherein each of the second plurality of outer bitlines includes a second portion configured to fly over or fly under a corresponding inner bitline, and
as part of a burst, outputting data into the output data latch corresponding to a subset of each of the first set of memory cells, the second set of memory cells, the third set of memory cells, and the fourth set of memory cells sensed by a selected set of the plurality of sense elements corresponding to a selected set of the plurality of columns.

10. The memory system of claim 9, wherein each of the first set of memory cells and the second set of memory cells is organized in a plurality of columns, and wherein the control unit is further configured to generate control signals for selecting one column at a time from among the plurality of columns in response to an assertion of a read column select signal for outputting the data as part of the burst.

11. The memory system of claim 9, wherein each of the plurality of sense elements further includes at least one logic gate comprising at least one of a NOR gate or a NAND gate.

12. A memory system comprising:
a first memory sub-array and a second memory sub-array, wherein the first memory sub-array includes a first set of memory cells coupled to a first inner wordline and a second set of memory cells coupled to a first outer wordline, wherein the second memory sub-array includes a third set of memory cells coupled to a second inner wordline and a fourth set of memory cells coupled to a second outer wordline, wherein each of the first set of memory cells and the second set of memory cells is organized in a first plurality of columns, and wherein each of the third set of memory cells and the fourth set of memory cells is organized in a second plurality of columns;
a plurality of sense elements coupled to a plurality of columns such that each of the plurality of columns has a corresponding sense element, wherein the plurality of columns is coupled to a shared column multiplexer, and wherein each of the plurality of sense elements comprises a plurality of inverters coupled in series between an output data latch and the shared column multiplexer; and
a control unit configured to generate control signals both for:
in a first burst mode, in response to a first burst mode read request, simultaneously: (1) asserting a first wordline signal on the first inner wordline coupled to each of a first plurality of inner bitlines, (2) asserting a second wordline signal on the first outer wordline coupled to each of a first plurality of outer bitlines, wherein each of the first plurality of outer bitlines includes a first portion configured to fly over or fly under a corresponding inner bitline, (3) asserting a third wordline signal on the second inner wordline coupled to each of a second plurality of inner bitlines, (4) asserting a fourth wordline signal on the second outer wordline coupled to each of a second plurality of outer bitlines, wherein each of the second plurality of outer bitlines includes a second portion configured to fly over or fly under a corresponding inner bitline, and using the shared column circuitry, and outputting data into the output data latch from each of the first set of memory cells, the second set of memory cells, the third set of memory cells, and the fourth set of memory cells as part of a burst, and in a second burst mode, in response to a second burst mode read request, simultaneously: (1) asserting a first wordline signal on the first inner wordline coupled to each of a first plurality of inner bitlines, and (2) asserting a second wordline signal on the first outer wordline coupled to each of a first plurality of outer bitlines, wherein each of the first plurality of outer bitlines includes a first portion configured to fly over or fly under a corresponding inner bitline, and outputting data into the output data latch from each of the first set of memory cells and the second set of memory cells.

13. The memory system of claim 12, wherein each of the plurality of sense elements further includes at least one logic gate comprising at least one of a NOR gate or a NAND gate.

14. The memory system of claim 13, wherein the control unit is further configured to generate control signals for selecting one column at a time from among the plurality of columns in response to an assertion of a read column select signal for outputting the data as part of the burst.

15. The memory system of claim 14, wherein the control unit is further configured to generate control signals for selecting one column at a time from among the second plurality of columns in response to an assertion of a read column select signal for outputting the data as part of the burst.

16. The memory system of claim 15, wherein at least one of the plurality of sense elements is coupled to the first plurality of columns and the second plurality of columns such that each of the first plurality of columns and the second plurality of columns has a corresponding shared sense element from among the plurality of sense elements.

17. The memory system of claim 12, wherein the memory system is formed as part of an integrated circuit, wherein each of the first plurality of inner bitlines and the second plurality of inner bitlines is formed in a first metal layer associated with the integrated circuit, and wherein each of the first portion configured to fly over or fly under a corresponding inner bitline and the second portion configured to fly over or fly under a corresponding inner bitline is formed in a second metal layer, different from the first metal layer.

18. The memory system of claim 17, wherein each of the first plurality of outer bitlines includes a second portion formed in the first metal layer, and wherein the first portion configured to fly over or fly under the corresponding inner bitline is coupled to the second portion formed in the first metal layer via an interconnect.

19. The memory system of claim 18, wherein each of the second plurality of outer bitlines includes a second portion formed in the first metal layer, and wherein the second portion configured to fly over or fly under the corresponding inner bitline is coupled to the second portion formed in the first metal layer via an interconnect.

20. The memory system of claim 19, wherein the output data latch is for latching data sensed by one or more of the plurality of sense elements.

* * * * *